United States Patent
Sugiyama et al.

(10) Patent No.: US 12,312,475 B2
(45) Date of Patent: May 27, 2025

(54) COLLOIDAL SILICA FOR METAL POLISHING

(71) Applicant: FUSO CHEMICAL CO., LTD., Osaka (JP)

(72) Inventors: Daisuke Sugiyama, Fukuchiyama (JP); Chiharu Nakano, Fukuchiyama (JP)

(73) Assignee: FUSO CHEMICAL CO., LTD., Osaka (JP)

( * ) Notice: Subject to any disclaimer, the term of this patent is extended or adjusted under 35 U.S.C. 154(b) by 735 days.

(21) Appl. No.: 17/605,304

(22) PCT Filed: Apr. 14, 2020

(86) PCT No.: PCT/JP2020/016437
§ 371 (c)(1),
(2) Date: Oct. 21, 2021

(87) PCT Pub. No.: WO2020/218089
PCT Pub. Date: Oct. 29, 2020

(65) Prior Publication Data
US 2022/0228001 A1    Jul. 21, 2022

(30) Foreign Application Priority Data

Apr. 22, 2019  (JP) .................................. 2019-080611

(51) Int. Cl.
C09C 1/30 (2006.01)
C09K 3/14 (2006.01)

(52) U.S. Cl.
CPC .......... *C09C 1/3081* (2013.01); *C09K 3/1409* (2013.01)

(58) Field of Classification Search
CPC ........................ C09C 1/3081; C09K 3/1409
USPC ......................................................... 423/335
See application file for complete search history.

(56) References Cited

U.S. PATENT DOCUMENTS

| | | |
|---|---|---|
| 2011/0081780 A1 | 4/2011 | Shida et al. |
| 2016/0027657 A1 | 1/2016 | Shi et al. |
| 2017/0292039 A1 | 10/2017 | Sato et al. |
| 2019/0172720 A1 | 6/2019 | Shi et al. |
| 2021/0139739 A1 | 5/2021 | Yoshizaki et al. |

FOREIGN PATENT DOCUMENTS

| | | |
|---|---|---|
| CN | 106795421 A | 5/2017 |
| JP | 2004-014813 A | 1/2004 |
| JP | 2010-41029 A | 2/2010 |
| JP | 2016-30831 A | 3/2016 |

(Continued)

OTHER PUBLICATIONS

Machine Translation of WO 2018168206 A1. (Year: 2018).*

(Continued)

*Primary Examiner* — Melissa S Swain
*Assistant Examiner* — Catriona M Corallo
(74) *Attorney, Agent, or Firm* — WHDA, LLP (57) ABSTRACT

The problem to be solved by the present invention is to provide colloidal silica for metal polishing that is capable of achieving a high polishing rate. This problem can be achieved by a colloidal silica for metal polishing, comprising a silica particle having a surface on which a functional group having at least one carboxyl group is immobilized by covalent bonding.

11 Claims, 1 Drawing Sheet

(56) References Cited

FOREIGN PATENT DOCUMENTS

| | | |
|---|---|---|
| JP | 2016-69622 A | 5/2016 |
| WO | 2018/168206 A1 | 9/2018 |

OTHER PUBLICATIONS

Office Action dated Jul. 26, 2023, issued in counterpart CN application No. 202080030757.9, with partial English translation. (10 pages).
International Search Report dated Jul. 7, 2020, issued in counterpart International Application No. PCT/JP2020/016437. (2 pages).
Kazuo Yamaguchi et al., "Novel Silane Coupling Agents Containing a Photolabile 2-Nitrobenzyl Ester for Introduction of a Carboxy Group on the Surface of Silica Gel", Chemistry Letters 2000, vol. 3, p. 228-229, Cited in CN Office Action dated Jul. 26, 2023, and cited in the CN Office Action dated Feb. 21, 2024.
Office Action dated Feb. 21, 2024, issued in counterpart CN Application No. 202080030757.9, with English translation. (12 pages).

\* cited by examiner

COLLOIDAL SILICA FOR METAL POLISHING

TECHNICAL FIELD

The present invention relates to colloidal silica for metal polishing.

BACKGROUND ART

Colloidal silica, which is obtained by dispersing silica particles in a medium such as water, is used as an abrasive for semiconductor wafers etc.

For example, JP2010-41029A (PTL 1) discloses an aqueous dispersion for chemical mechanical polishing that contains silica particles having predetermined chemical properties and an organic acid having two or more carboxyl groups. PTL 1 discloses the following effects of an organic acid: (1) organic acids coordinate with metal ions, such as copper, tantalum, and titanium, that are eluted into an aqueous dispersion due to polishing, and prevent deposition of the metal; (2) organic acids improve the polishing rate for polished objects such as copper films, barrier metal films, and TEOS films; (3) organic acids coordinate with sodium or potassium ions eluted from silica particles ground during polishing, and inhibit the adsorption of sodium or potassium ions onto the surface of the polished object; and (4) organic acids adsorb onto the surface of silica particles and increase the dispersion stability of silica particles.

Further, JP2016-30831A (PTL 2) discloses a polishing composition for chemical mechanical polishing (CMP) of cobalt-containing substrates, the composition comprising a predetermined amount of an abrasive, such as colloidal silica, and a predetermined amount of at least two types of specific chelators, wherein the remaining portion is substantially deionized water, and wherein the pH of the polishing composition is 2.0 to 12. PTL 2 discloses that a combined use of two different types of chelators can achieve a cobalt removal rate higher than that achieved with the use of a single chelator.

CITATION LIST

Patent Literature

PTL 1: JP2010-41029A
PTL 2: JP2016-30831A

SUMMARY OF INVENTION

Technical Problem

In metal polishing, a further improvement in the polishing rate, more than that achieved with the polishing compositions of PTL 1 or PTL 2, is required.

An object of the present invention is to provide a colloidal silica for metal polishing that is capable of achieving a high polishing rate.

Solution to Problem

As a result of extensive research to achieve the above object, the present inventors found that a high polishing rate can be achieved when metal is polished by using colloidal silica that contains a silica particle having a surface on which a functional group having at least one carboxyl group is immobilized by covalent bonding. Based on this finding, further research was made to thus complete the present invention.

More specifically, the present invention includes the following embodiments.

Item 1.

A colloidal silica for metal polishing, comprising a silica particle having a surface on which a functional group having at least one carboxyl group is immobilized by covalent bonding.

Item 2.

The colloidal silica according to Item 1, wherein the silica particle has a surface on which a group represented by the following formula (1):

wherein $R^1$ is an organic functional group having at least one carboxyl group, and $R^2$ and $R^3$ are identical or different, and each represents a hydrogen atom, a hydrocarbon group, or $-OR^4$, where $R^4$ is a hydrogen atom, a hydrocarbon group, or a silicon-containing group, is present.

Item 3.

The colloidal silica according to Item 1 or 2, wherein the silica particle has a surface modified with a silane coupling agent or a hydrolysis condensation product thereof, the silane coupling agent containing a functional group having at least one carboxyl group or a precursor group thereof.

Item 4.

The colloidal silica according to any one of Items 1 to 3, wherein the metal is a transition metal.

Item 5.

The colloidal silica according to Item 4, wherein the transition metal is at least one member selected from cobalt, ruthenium, copper, tungsten, tantalum, and titanium.

Advantageous Effects of Invention

The use of the colloidal silica according to the present invention in polishing metal can achieve a high polishing rate. Further, the colloidal silica according to the present invention is capable of achieving a high polishing rate for metal, even with a low concentration of silica particles in the polishing composition.

DESCRIPTION OF EMBODIMENTS

The colloidal silica for metal polishing according to the present invention comprises a silica particle having a surface on which a functional group having at least one carboxyl group is immobilized by covalent bonding (referred to below as "the surface-modified silica particle"). The functional group is preferably an organic functional group having at least one carboxyl group, and more preferably a hydrocarbon group having at least one carboxyl group. The number of carboxyl groups in the functional group is preferably 1 to 4, more preferably 1 to 3, and even more preferably 1 to 2. The position of the carboxyl group may be at the end of the functional group or at a moiety other than the end; however, at least one carboxyl group is preferably present at the end.

The surface-modified silica particle is, for example, a silica particle in which the hydrogen atom of a hydroxyl group (silanol group) on the surface is replaced by a functional group having at least one carboxyl group.

That is, the surface-modified silica particle is, for example, a silica particle having a surface on which a group represented by the formula: —OR, wherein R is a functional group having at least one carboxyl group, is present, instead of a hydroxyl group. The oxygen atom in —OR is bonded to the silicon atom inside the silica particle.

The —OR is not particularly limited, and is typically a group represented by the following formula (1):

(1)

wherein $R^1$ is an organic functional group having at least one carboxyl group, and $R^2$ and $R^3$ are identical or different, and each represents a hydrogen atom, a hydrocarbon group, or —$OR^4$, where $R^4$ is a hydrogen atom, a hydrocarbon group, or a silicon-containing group.

Examples of the organic functional group represented by $R^1$ include hydrocarbon groups and heteroatom-containing hydrocarbon groups.

Examples of hydrocarbon groups include alkyl, cycloalkyl, aryl, and aralkyl groups.

Examples of alkyl groups include $C_{1-12}$ alkyl groups, such as methyl, ethyl, propyl (n-propyl, i-propyl), butyl (n-butyl, i-butyl, s-butyl, t-butyl), pentyl, and hexyl groups.

Examples of cycloalkyl groups include $C_{5-12}$ cycloalkyl groups, such as cyclopentyl and cyclohexyl groups.

Examples of aryl groups include $C_{6-12}$ aryl groups, such as phenyl and naphthyl groups.

Examples of aralkyl groups include $C_{6-12}$ aryl $C_{1-4}$ alkyl groups, such as benzyl and phenethyl groups.

The heteroatom-containing hydrocarbon group is preferably a hydrocarbon group containing at least one heteroatom selected from the group consisting of an oxygen atom, a sulfur atom, and a nitrogen atom. Examples include oxygen-containing alkyl groups (e.g., alkoxy group, alkoxyalkyl group), sulfur-containing alkyl groups (e.g., alkylthioalkyl group), nitrogen-containing alkyl groups (e.g., monoalkylaminoalkyl group, dialkylaminoalkyl group), oxygen-containing heterocyclic groups (e.g., oxygen-containing aromatic heterocyclic groups, such as furan and benzofuran), sulfur-containing heterocyclic groups (e.g., oxygen-containing aromatic heterocyclic groups, such as thiophene and benzothiophene), and nitrogen-containing heterocyclic groups (e.g., nitrogen-containing aromatic heterocyclic groups, such as pyrrole, pyridine, indole, and quinoline). In the heteroatom-containing hydrocarbon groups, the number of heteroatoms is preferably 1 to 3, and more preferably 1 or 2.

$R^1$ is preferably an alkyl group having at least one carboxyl group, an alkoxyalkyl group having at least one carboxyl group, an alkylthioalkyl group having at least one carboxyl group, or an alkylaminoalkyl group having at least one carboxyl group. These groups more preferably have 1 to 4 carboxyl groups, even more preferably 1 to 3 carboxyl groups, and most preferably 1 to 2 carboxyl groups.

Examples of the hydrocarbon group represented by $R^2$ to $R^4$ include the same hydrocarbon groups listed above as examples of the organic functional group represented by $R^1$. The hydrocarbon group here is preferably an alkyl group, and more preferably a $C_{1-4}$ alkyl group.

The silicon-containing group represented by $R^4$ may be a group formed by reaction with another silanol group present on the surface or with a group in which a hydrogen atom of the silanol group is replaced by a functional group having at least one carboxyl group, or may be a group formed by reaction with a silane coupling agent (e.g., silane coupling agents mentioned below as examples of a surface modifier).

The surface-modified silica particle is preferably a silica particle having a surface modified with a compound containing a functional group having at least one carboxyl group or a precursor group thereof (referred to below as "the surface modifier").

Examples of carboxyl precursor groups include carboxylic acid ester groups (e.g., carboxylic acid alkyl ester groups, such as carboxylic acid methyl ester and carboxylic acid ethyl ester) and carboxylic acid anhydride groups.

Examples of the at least one carboxyl group or a precursor group thereof include one carboxyl group, one carboxylic acid ester group, two carboxyl groups, one carboxylic acid anhydride group, and two carboxylic acid ester groups.

The surface modifier usually contains a reactive group that is reactive with the hydroxyl groups (silanol groups) on the surface of the silica particles, and is typically a silane coupling agent or a hydrolysis condensation product thereof.

Examples of the silane coupling agent include a compound represented by the following formula (2):

(2)

wherein $Q^1$ is a hydrogen atom or a hydrocarbon group, $R^5$ and $R^6$ are identical or different, and each represents a hydrogen atom, a hydrocarbon group, or —$OR^7$, where $R^7$ is a hydrogen atom or a hydrocarbon group, and $R^1$ is as defined above.

Examples of the hydrocarbon group represented by $Q^1$ and $R^5$ to $R^7$ include the same hydrocarbon groups listed above as examples of the organic functional group represented by $R^1$. $Q^1$ and $R^5$ to $R^7$ each preferably represent an alkyl group, and more preferably a $C_{1-4}$ alkyl group.

The silane coupling agent is preferably a compound represented by the following formula (3):

(3)

wherein $R^8$ is a $C_{1-6}$ alkyl group having 1 to 3 carboxyl groups, a $C_{1-6}$ alkoxy $C_{1-6}$ alkyl group having 1 to 3 carboxyl groups, a $C_{1-6}$ alkylthio $C_{1-6}$ alkyl group having 1 to 3 carboxyl groups, or a mono- or di-$C_{1-6}$ alkylamino $C_{1-6}$ alkyl group having 1 to 3 carboxyl groups, and $Q^2$ to $Q^4$ are identical or different, and each represents a hydrogen atom or a $C_{1-4}$ alkyl group.

The silane coupling agent is further preferably a (tri-$C_{1-4}$ alkoxysilyl)$C_{1-6}$ alkane having at least one carboxyl group or a precursor group thereof, or a hydrolysis product thereof, such as a 3-(trimethoxysilyl)propylsuccinic anhydride or a hydrolysis product thereof, or a 3-(triethoxysilyl)propylsuccinic anhydride or a hydrolysis product thereof; or a silane coupling agent disclosed in JP2000-336093A, JP2013-116872A, WO 2018/210711, and the like.

The silane coupling agent or a hydrolysis condensation product may be combined with other silane coupling agents or hydrolysis condensation products thereof. Examples of other silane coupling agents include alkylsilanes (e.g., methyltrimethoxysilane, methyltriethoxysilane, propyltrimethoxysilane, propyltriethoxysilane, isobutyltrimethoxysilane, isobutyltriethoxysilane, octyltrimethoxysilane, octyltriethoxysilane), phenylsilanes (e.g., phenyltrimethoxysilane and phenyltriethoxysilane), and mercaptoalkylsilanes (e.g., 3-mercaptopropylmethyldimethoxysilane and 3-mercaptopropyltrimethoxysilane). These may be used singly, or in a combination of two or more.

The amount of carboxyl groups on the surface of the surface-modified silica particle is preferably 0.05 atomic % or more, and more preferably 0.07 atomic % or more, from the standpoint of further improving the polishing rate. The amount of carboxyl groups on the surface of the surface-modified silica particle is preferably 0.5 atomic % or less, and more preferably 0.3 atomic % or less, from the standpoint of the dispersion stability in a solvent.

In the present specification, the amount of carboxyl groups on the surface of the surface-modified silica particles is determined by X-ray photoelectron spectroscopy under the following conditions, using a sample obtained by centrifuging colloidal silica at 5° C. at 77,000 G for 90 minutes, and drying the obtained precipitates at 60° C. for 12 hours, followed by grinding and then drying at 60° C. for 2 hours under reduced pressure.
Measurement device: Thermo Scientific K-Alpha$^+$ XPS spectrometer, produced by Thermo Fisher Scientific, single-crystal spectroscopy using Al Kα
X-ray spot diameter: 400 μm
Here, the state ratio of a binding energy of 289.4 to 289.8 eV is calculated to be the amount of carboxyl groups on the particle surface using the standardized binding energy of C—C or C—H taken as 284.6 eV. The state ratio is calculated using the relative sensitivity factor (RSF) provided with the device.

The colloidal silica has a zeta potential, for example, at a pH of 4 of preferably −60 to −10 mV, more preferably −55 to −15 mV, and particularly preferably −50 to −20 mV.

In the colloidal silica, the difference between the zeta potential at a pH of 3 and the zeta potential at a pH of 6 is preferably 20 mV or more, more preferably 40 mV or more, and particularly preferably 60 mV or more.

In the present specification, the zeta potential of colloidal silica can be measured with a device using measurement principles of ultrasonic attenuation.

The surface-modified silica particles have a BET specific surface are of, for example, 15 to 550 m$^2$/g, preferably 20 to 280 m$^2$/g, and even more preferably 30 to 180 m$^2$/g.

In the present specification, the BET specific surface area can be measured by using a sample obtained by pre-drying colloidal silica on a hot plate, followed by heating at 800° C. for 1 hour.

The surface-modified silica particles have an average primary particle size of preferably 5 nm or more, more preferably 10 nm or more, and even more preferably 15 nm or more, from the standpoint of further improving the polishing rate. Further, the surface-modified silica particles have an average primary particle size of preferably 200 nm or less, more preferably 150 nm or less, and even more preferably 100 nm or less, from the standpoint of suppressing the formation of scratches on the metal to be polished.

In the present specification, the average primary particle size of the surface-modified silica particles is calculated by 2727/BET specific surface area (m$^2$/g), regarding the density of silica particles as 2.2.

The surface-modified silica particles have an average secondary particle size of preferably 6 nm or more, more preferably 12 nm or more, and even more preferably 18 nm or more, from the standpoint of further improving the polishing rate. Further, the surface-modified silica particles have an average secondary particle size of preferably 400 nm or less, more preferably 350 nm or less, and even more preferably 300 nm or less, from the standpoint of suppressing the formation of scratches on the metal to be polished.

In the present specification, the average secondary particle size of surface-modified silica particles is measured by dynamic light scattering (ELSZ-2000S, produced by Otsuka Electronics Co., Ltd.) using a sample obtained by adding colloidal silica to a 0.05 mass % aqueous sodium dodecyl sulfate (SDS) solution, followed by homogenization.

The surface-modified silica particles have an aggregation ratio of preferably 1.2 or more, more preferably 1.4 or more, and even more preferably 1.6 or more, from the standpoint of further improving the polishing rate. Further, the surface-modified silica particles have an aggregation ratio of preferably 5.5 or less, more preferably 5.0 or less, and even more preferably 4.0 or less, from the standpoint of suppressing the formation of scratches on the metal to be polished.

In the present specification, the aggregation ratio of surface-modified silica particles is calculated by average secondary particle size/average primary particle size.

The surface-modified silica particles may be deformed particles. That is, the surface-modified silica particles preferably have a bent structure and/or a branched structure. The "bent structure" refers to the structure of a secondary particle formed of at least 3 primary particles bound to each other in a line, but not in a straight line. The "branched structure" refers to the structure of a secondary particle formed of at least 4 primary particles that are bound to each other, but not in a line (branched).

The surface-modified silica particles have a particle density of 1.50 or more, more preferably 1.65 or more, and even more preferably 1.80 or more. A lower limit of the particle density falling within these ranges further increases the abrasiveness of the colloidal silica according to the present invention. The particle density is preferably 2.30 or less, more preferably 2.20 or less, and even more preferably 2.16 or less. An upper limit of the particle density falling within these ranges further suppresses the formation of scratches on a polished object.

The particle density can be measured by drying and hardening a sample on a hot plate at 150° C., keeping the sample in a furnace at 300° C. for 1 hour, and then measuring its particle density by a liquid-phase displacement method by using ethanol.

The colloidal silica is obtained by dispersing surface-modified silica particles in a dispersion medium.

Examples of the dispersion medium include water, organic solvents, and mixed solvents of these.

The organic solvent is usually a hydrophilic organic solvent. Examples include alcohols (e.g., methanol, ethanol, n-propanol, isopropanol, ethylene glycol, propylene glycol, and 1,4-butanediol), ketones (e.g., acetone and methyl ethyl ketone), and esters (e.g., ethyl acetate). These organic solvents may be used singly, or in a combination of two or more.

The dispersion medium is preferably water and/or alcohol, and even more preferably water and/or methanol.

The content of the surface-modified silica particles in colloidal silica is, for example, 0.1 to 30 mass %, and preferably 0.3 to 20 mass %.

The colloidal silica comprising the surface-modified silica particles may be produced by, for example, a method based on a sol-gel method. For example, the method based on a sol-gel method is a method that comprises the steps of:

(1) preparing a mixture containing an alkoxysilane, an alkaline catalyst, and water and/or an organic solvent (which may be referred to below as "the silica sol"); and
(2) reacting the mixture with a compound (surface modifier) containing a functional group having at least one carboxyl group or a precursor group thereof.

Step (1)

Examples of alkoxysilanes include tetra-$C_{1-8}$ alkoxysilanes, such as tetramethoxysilane, tetraethoxysilane, and tetraisopropoxysilane. These may be used singly, or in a combination of two or more. Of these, tetra-$C_{1-4}$ alkoxysilanes are preferred, and tetramethoxysilane and/or tetraethoxysilane are even more preferred.

The type of the alkaline catalyst is not particularly limited. To avoid metal impurity contamination, the alkaline catalyst is preferably an organic base catalyst that does not contain a metal component, and particularly preferably a nitrogen-containing organic base catalyst. Examples of such organic base catalysts include ethylenediamine, diethylenetriamine, triethylenetetramine, ammonia, urea, monoethanol amine, diethanol amine, triethanol amine, tetramethylammonium hydroxide (TMAH), tetramethylguanidine, 3-ethoxypropylamine, dipropylamine, and triethylamine. These may be used singly, or in a combination of two or more. Ammonia, which has excellent catalytic activity and high volatility, and which can be easily removed in a subsequent step, is preferred. From the standpoint of increasing the density of silica particles, it is preferable to select an organic base catalyst with a boiling point of 90° C. or higher so as to avoid volatilization even when the reaction temperature is increased, and it is more preferable to use at least one member selected from tetramethylammonium hydroxide and 3-ethoxypropylamine.

The organic solvent may be any organic solvent that are listed above as examples for colloidal silica. The organic solvent is preferably an alcohol, and more preferably methanol.

The silica sol may be prepared, for example, by a method comprising mixing each component sequentially or simultaneously, a method comprising mixing a mixture of two or more members selected from an alkoxysilane, an alkaline catalyst, and water and/or an organic solvent with the remaining components, or a method comprising mixing two or three types of mixtures with each other.

The silica sol is typically prepared by a method comprising mixing a first mixture containing an alkoxysilane and optionally an organic solvent with a second mixture containing an alkaline catalyst, water, and optionally an organic solvent.

The content of the alkoxysilane is, for example, 70 to 100 mass %, and preferably 75 to 100 mass %, with the amount of the first mixture taken as 100 mass %.

The content of the alkaline catalyst is, for example, 0.001 to 3.0 mass %, and preferably 0.002 to 1.5 mass %, with the amount of the second mixture taken as 100 mass %.

The mixing ratio (mass ratio) of the first mixture and the second mixture is, for example, 5:95 to 50:50, and preferably 10:90 to 45:55.

The mixing temperature of the first mixture and the second mixture is not particularly limited, and is, for example, 0 to 100° C., and preferably 0 to 90° C.

The content of silica particles in the silica sol is not particularly limited, and is, for example, 5 to 35 mass %, and preferably 10 to 30 mass %. In order to adjust the content of silica particles to be within these ranges, the silica sol may be optionally concentrated.

For production methods for silica sol, for example, JP2005-60217A and JP2010-269985A may be referred to.

Step (2)

Step (2) may be, for example, either the following Step (2A) or Step (2B).

Step (2A): reacting the silica sol with a surface modifier containing at least one carboxyl precursor group, and converting the carboxyl precursor group to a carboxyl group in the reaction product.

Step (2B): reacting the silica sol with a surface modifier containing at least one carboxyl group (including a surface modifier in which a carboxyl precursor group has been converted to a carboxyl group).

In step (2A) and step (2B), the conversion from a carboxyl precursor group to a carboxyl group may be performed by general-purpose methods. For example, the conversion from a carboxylic acid ester group or a carboxylic acid anhydride group to a carboxyl group may be performed by hydrolysis.

Of these, step (2B) is preferred.

The surface modifier may be any surface modifier that is listed above as examples for the surface-modified silica particles.

The amount of the surface modifier for use is, for example, 5 to 750 μmol, and preferably 10 to 500 μmol, per 1 g of the silica particles before surface modification.

The mixing temperature of the silica sol and the surface modifier is, for example, 0 to 150° C., preferably 0 to 120° C., and even more preferably 10 to 90° C.

The colloidal silica may be suitably used for metal polishing. The polishing may be, for example, chemical mechanical polishing (CMP). The polishing conditions may be known or commonly used conditions.

The composition for metal polishing is not particularly limited as long as the composition comprises the colloidal silica described above. The composition may further comprise additives. Examples of additives include diluents, oxidants, pH adjusters, corrosion inhibitors, stabilizers, and surfactants. These may be used singly, or in a combination of two or more.

The content of the surface-modified silica particles (or abrasive grains) in the composition for metal polishing is, for example, 0.1 to 30 mass %, preferably 0.3 to 20 mass %, and even more preferably 0.5 to 10 mass %. In the present invention, a high polishing rate can be achieved even with a low content of the surface-modified silica particles.

The metal to be polished is not particularly limited. Examples include transition metals. Preferable examples of transition metals include cobalt, ruthenium, copper, tungsten, tantalum, and titanium. Of these, at least one member selected from cobalt, ruthenium, and copper is more preferred.

The object to be polished is usually a metal film.

The use of the colloidal silica according to the present invention can improve the polishing rate for a metal film. Further, the ratio of the polishing rate for a metal film to the polishing rate for a silicon oxide film can be increased; thus, it is possible to selectively polish a metal film.

The metal may be for use in various applications, and may be, for example, metal films for semiconductors (e.g., metal films for electrode wiring and barrier metal films).

EXAMPLES

The present invention will be described in more detail below with reference to Examples; however, the present invention is not limited to these Examples.

Example 1

A mixed liquid of 1522.2 g of tetramethoxysilane and 413.0 g of methanol was added dropwise to a mixed liquid of 2212.7 g of pure water, 567.3 g of 26 mass % aqueous ammonia, and 12391 g of methanol over 25 minutes while the liquid temperature was maintained at 20° C. to obtain a silica sol methanol dispersion 1. The obtained silica sol methanol dispersion 1 was concentrated under ordinary pressure while keeping the volume constant by adding dropwise the silica sol methanol dispersion 1 to thus obtain a silica sol methanol dispersion 2, in which the silica concentration was concentrated to 20 mass %.

800 g of the silica sol methanol dispersion 2 was placed in a 1-L flask, and 21.6 g of a hydrolysis product of (3-trimethoxysilylpropyl) succinic anhydride diluted with pure water so that the active ingredient was 10 mass % was added thereto. Then, in order to distill off methanol from the dispersion, 1300 mL of pure water was added while keeping the volume constant. Subsequently, the resulting product was heated and refluxed at 100° C. so as to allow a reaction to occur with the hydrolysis product of (3-trimethoxysilylpropyl)succinic anhydride. The heating and refluxing were performed until the total time of solvent replacement and heating and refluxing reached 24 hours, thus obtaining colloidal silica S1 having a silica particle concentration of 19.5 mass %.

Example 2

2740 g of tetramethoxysilane was added dropwise to a mixed liquid of 7500 g of pure water and 1.93 g of 3-ethoxypropylamine over 60 minutes while the liquid temperature was maintained at 85° C. Fifteen minutes after the completion of dropwise addition, 50.14 g of 3-ethoxypropylamine was added thereto to obtain a silica sol methanol dispersion 3.

1762.7 g of tetramethoxysilane was added dropwise to a mixed liquid of 5537 g of pure water and 2452 g of the silica sol methanol dispersion 3 over 360 minutes while the liquid temperature was maintained at 80° C. to obtain a silica sol methanol dispersion 4.

The obtained silica sol methanol dispersion 4 was concentrated under ordinary pressure while keeping the volume constant by adding dropwise the silica sol methanol dispersion 4 to obtain a silica sol methanol dispersion 5, in which the silica concentration was concentrated to 20 mass %.

900 g of the silica sol methanol dispersion 5 was placed in a 1-L flask, and mixed with 1.550 g of 3-ethoxypropylamine. The pH of the mixed liquid at this time was 9.5. Subsequently, 21.6 g of a hydrolysis product of (3-trimethoxysilylpropyl) succinic anhydride diluted with pure water so that the active ingredient was 10 mass % was added thereto. Then, in order to distill off methanol from the dispersion, 450 mL of pure water was added dropwise while keeping the volume constant. Subsequently, the resulting product was heated and refluxed at 100° C. so as to allow a reaction to occur with the hydrolysis product of (3-trimethoxysilylpropyl)succinic anhydride. The heating and refluxing were performed until the total time of solvent replacement and heating and refluxing reached 24 hours, thus obtaining colloidal silica S2 having a silica particle concentration of 20.0 mass %.

Comparative Example 1

In order to distill off methanol, 1300 mL of pure water was added dropwise to the silica sol methanol dispersion 2 described in Example 1 while keeping the volume constant, thus obtaining colloidal silica S3 having a silica particle concentration of 19.5 mass %.

Comparative Example 2

1.84 g of 3-mercaptopropyltrimethoxysilane and 4.25 g of a 30 mass % aqueous solution of hydrogen peroxide were added to the silica sol methanol dispersion 2 described in Example 1. Then, in order to distill off methanol from the dispersion, 1300 mL of pure water was added thereto dropwise while keeping the volume constant, thus obtaining colloidal silica S4 having a silica particle concentration of 19.5 mass %.

Comparative Example 3

Maleic acid-containing colloidal silica S5 was obtained by adding 1.064 g of maleic acid to the colloidal silica S3 prepared in Comparative Example 1.

The BET specific surface area, the primary particle size, the secondary particle size, the aggregation ratio, the particle density, and the amount of surface modification of the colloidal silica obtained in the Examples and Comparative Examples were evaluated as described below.

BET Specific Surface Area

A measurement sample was prepared by pre-drying colloidal silica on a hot plate, followed by heating at 800° C. for 1 hour. The BET specific surface area of the prepared measurement sample was measured.

Primary Particle Size

The value calculated by 2727/specific surface area ($m^2/g$) was determined as the primary particle size (nm) of colloidal silica.

Secondary Particle Size

A dynamic light scattering measurement sample was prepared by adding colloidal silica to a 0.05 mass % aqueous sodium dodecyl sulfate (SDS) solution, followed by homogenization. The secondary particle size of this measurement sample was measured by dynamic light scattering (ELSZ-20005, produced by Otsuka Electronics Co., Ltd.).

Aggregation Ratio

The value calculated by secondary particle size/primary particle size was defined as the aggregation ratio.

Particle Density

The particle density was measured by drying and hardening a sample on a hot plate at 150° C., keeping the sample in a furnace at 300° C. for 1 hour, and then measuring its particle density by a liquid-phase displacement method by using ethanol.

Amount of Surface Modification

A colloidal silica solution was centrifuged at 5° C. at 77,000 G for 90 minutes. The obtained precipitates were dried at 60° C. for 12 hours, and then the silica was ground and dried at 60° C. for 2 hours under reduced pressure to prepare a measurement sample. The amount of carboxyl groups on the surface of this measurement sample was measured by X-ray photoelectron spectroscopy under the following conditions.
Measurement device: Thermo Scientific K-Alpha$^+$ XPS spectrometer, produced by Thermo Fisher Scientific, single-crystal spectroscopy using Al Kα
X-ray spot diameter: 400 μm
Here, the state ratio of a binding energy of 289.4 to 289.8 eV was calculated to be the amount of carboxyl groups on the particle surface using the standardized binding energy of C—C or C—H taken as 284.6 eV. The state ratio was calculated using the relative sensitivity factor (RSF) provided with the device.

Table 1 shows the evaluation results of physical properties of the colloidal silica of the Examples and Comparative Examples.

TABLE 1

|  | Ex. 1 | Ex. 2 | Comp. Ex. 1 | Comp. Ex. 2 | Comp. Ex. 3 |
|---|---|---|---|---|---|
| Colloidal silica | S1 | S2 | S3 | S4 | S5 |
| BET specific surface area (m²/g) | 76.5 | 136.4 | 76.8 | 87.4 | 76.8 |
| Primary particle size (nm) | 35.7 | 20.0 | 35.5 | 31.2 | 35.5 |
| Secondary particle size (nm) | 71 | 36 | 68 | 70 | 68 |
| Aggregation ratio | 2.0 | 1.8 | 1.9 | 2.2 | 1.9 |
| Particle density | 1.81 | 2.11 | 1.82 | 1.82 | 1.82 |
| Amount of carboxyl groups on the particle surface (atomic %) | 0.10 | 0.11 | — | — | — |

The zeta potential of the colloidal silica of the Examples and Comparative Examples was evaluated as follows.

Zeta Potential

The zeta potential of colloidal silica was measured with a measurement device that uses an ultrasonic attenuation method.

Figure 1:
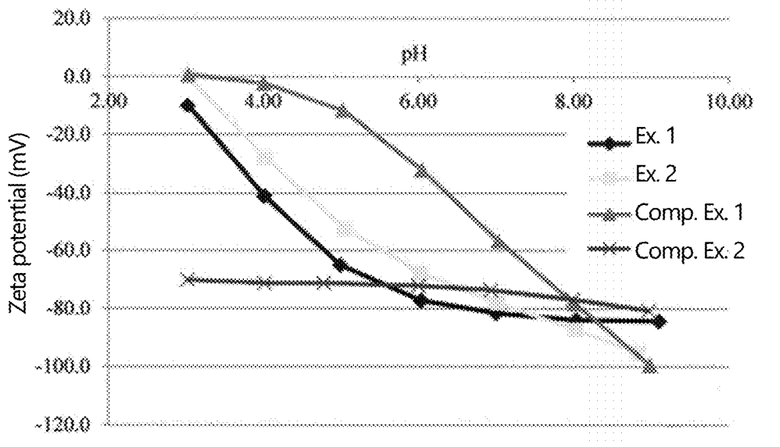
FIG. 1 is a graph showing the relationship between the pH and zeta potential of colloidal silica of the Examples and Comparative Examples.

FIG. 1 shows the measurement results of the zeta potential of colloidal silica of the Examples and Comparative Examples.

Polishing Test 1: Polishing Test for Co

The silica particle concentration of the colloidal silica of the Examples and Comparative Examples was adjusted to 8 wt %, and the polishing test was conducted under the following conditions.
Polishing device: NF-300CMP, produced by Nano Factor Co., Ltd.
Polishing pad: IC1000™ Pad, produced by Nitta Haas Incorporated
Slurry feed rate: 100 mL/min
Head rotation speed: 46 rpm
Platen rotation speed: 120 rpm
Polishing pressure: 2 psi for Co film, 3 psi for TEOS film
Polishing time: 0.5 min for Co film, 2 min for TEOS film
Film thickness measuring device: film thickness measuring device based on electrical resistance for Co film, film thickness measuring device based on optical interference for TEOS film
Table 2 shows the results of Polishing Test 1.

TABLE 2

|  |  | Ex. 3 | Comp. Ex. 4 | Comp. Ex. 5 |
|---|---|---|---|---|
| Abrasive grain |  | S1 | S3 | S4 |
| Abrasive grain concentration (wt %) |  | 8 | 8 | 8 |
| pH |  | 4 | 4 | 4 |
| Polishing rate | Co (Å/min) | 2364 | 954 | 962 |
|  | TEOS (Å/min) | 237 | 133 | 169 |
| Selective ratio | Co/TEOS | 9.9 | 7.2 | 5.7 |

The results of Polishing Test 1 show that the use of the colloidal silica S1 obtained in Example 1 achieved a polishing rate for cobalt (Co) of 2000 Å/min or more (Example 3), whereas the use of the unmodified colloidal silica S3 and the sulfonic acid-modified colloidal silica S4 achieved a polishing rate of less than 1000 Å (Comparative Examples 4 and 5).

Further, when S1 of the Example was used, the selective ratio calculated based on the ratio of the polishing rates for cobalt (Co) and silicon oxide film (TEOS) was 9.0 or more. However, when S3 and S4 of the Comparative Examples were used, the selective ratio was less than 8.0.

Polishing Test 2: Polishing Test for Co

The silica particle concentration of the colloidal silica of the Examples and Comparative Examples was adjusted to 5 wt %, and the polishing test was conducted under the following conditions.
Polishing device: NF-300CMP, produced by Nano Factor Co., Ltd.
Polishing pad: IC1000™ Pad, produced by Nitta Haas Incorporated
Slurry feed rate: 50 mL/min
Head rotation speed: 90 rpm
Platen rotation speed: 90 rpm
Polishing pressure: 4 psi for Co film, 4 psi for TEOS film
Polishing time: 0.5 min for Co film, 1 min for TEOS film
Film thickness measuring device: film thickness measuring device based on electrical resistance for Co film, film thickness measuring device based on optical interference for TEOS film
Table 3 shows the results of Polishing Test 2.

TABLE 3

|  | Ex. 4 | Comp. Ex. 6 |
|---|---|---|
| Abrasive grain | S1 | S5 |
| Abrasive grain concentration (wt %) | 5 | 5 |
| Concentration of carboxyl groups on the particle surface in polishing slurry (mmol/kg) | 5.06 | Unmodified silica was used |
| Concentration of carboxyl groups added to polishing slurry (mmol/kg) | Not added | 5.06 |
| pH | 4 | 4 |
| Polishing rate Co (Å/min) | 1637 | 1183 |
| TEOS (Å/min) | 206 | 502 |
| Selective ratio | 8.0 | 2.4 |

The results of Polishing Test 2 show that the use of the colloidal silica S1 achieved a polishing rate for cobalt (Co) of 1600 Å/min or more, whereas the use of S5, in which maleic acid with carboxyl groups was added to unmodified colloidal silica, achieved a polishing rate of less than 1200 Å.

Further, when S1 was used, the selective ratio calculated based on the ratio of the polishing rates for cobalt (Co) and silicon oxide film (TEOS) was 8.0 or more. However, when S3 and S4 of the Comparative Examples were used, the selective ratio was less than 3.0.

Polishing Test 3: Polishing Test for Ru

After the silica particle concentration of the colloidal silica of Example 1 and Comparative Example 3 was adjusted to 2 wt %, the oxidant concentration, pH, and electrical conductivity were adjusted as follows, and the resulting colloidal silica was subjected to the polishing test.
  Oxidant concentration: sodium periodate concentration: 0.25 wt % (relative to the weight of polishing slurry)
  pH adjustment: 1 mol/L sodium hydroxide and/or 10 wt % nitric acid was used
  Electrical conductivity of polishing slurry: sodium chloride was added to achieve 25 mS/cm
  Polishing test conditions:
  Polishing device: NF-300CMP, produced by Nano Factor Co., Ltd.
  Polishing pad: IC1000™ Pad, produced by Nitta Haas Incorporated
  Slurry feed rate: 50 mL/min
  Head rotation speed: 32 rpm
  Platen rotation speed: 32 rpm
  Polishing pressure: 6 psi for Ru film
  Polishing time: 1 min for Ru film
  Film thickness measuring device: film thickness measuring device based on electrical resistance for Ru film
Table 4 shows the results of Polishing Test 3.

TABLE 4

|  | Ex. 5 | Comp. Ex. 7 |
|---|---|---|
| Abrasive grain | S1 | S3 |
| Abrasive grain concentration (wt %) | 2 | 2 |
| Concentration of carboxyl groups on the particle surface in polishing slurry (mmol/kg) | 1.96 | Unmodified silica was used |
| Concentration of carboxyl groups added to polishing slurry (mmol/kg) | Not added | 1.96 |
| pH | 4 | 4 |
| Polishing rate: Ru (Å/min) | 386 | 308 |

The results of Polishing Test 3 show that the use of the colloidal silica S1 achieved a polishing rate of 380 Å/min or more for ruthenium (Ru) as well, which was 1.2 times greater than that achieved with the use of S5, in which maleic acid with carboxyl groups was added to unmodified colloidal silica.

Further, from the results of Polishing Test 2, the selective ratio of ruthenium (Ru) and silicon oxide film (TEOS) can be estimated to be 1.8 or more.

Polishing Test 4: Polishing Test for Cu

After the silica particle concentration of the colloidal silica of Example 1 and Comparative Example 3 was adjusted to 3 wt %, the oxidant concentration and pH were adjusted as follows, and the resulting colloidal silica was subjected to the polishing test.
  Oxidant concentration: Hydrogen peroxide concentration of 0.25 wt % (relative to the polishing slurry weight)
  PH adjustment: 60% perchloric acid was used Polishing Test Conditions Polishing device: NF-300CMP, produced by Nano Factor Co., Ltd.
Polishing pad: IC1000™ Pad, produced by Nitta Haas Incorporated
Slurry feed rate: 50 mL/min
Head rotation speed: 32 rpm
Platen rotation speed: 32 rpm
Polishing pressure: 1.5 psi for Cu film
Polishing time: 1 min for Cu film
Film thickness measuring device: film thickness measuring device based on electrical resistance for Cu film
Table 5 shows the results of Polishing Test 4.

TABLE 5

|  | Ex. 6 | Comp. Ex. 8 |
|---|---|---|
| Abrasive grain | S1 | S3 |
| Abrasive grain concentration (wt %) | 3 | 3 |
| Concentration of carboxyl groups on the particle surface in polishing slurry (mmol/kg) | 2.94 | Unmodified silica was used |
| Concentration of carboxyl groups added to polishing slurry (mmol/kg) | Not added | 2.94 |
| pH | 2 | 2 |
| Polishing rate: Cu (Å/min) | 1972 | 143 |

The results of Polishing Test 4 show that the use of the colloidal silica S1 achieved a polishing rate of 1900 Å/min or more for copper (Cu) as well, which was 13 times greater than that achieved with the use of S5, in which maleic acid with carboxyl groups was added to unmodified colloidal silica.

Further, from the results of Polishing Test 2, the selective ratio of copper (Cu) and silicon oxide film (TEOS) can be estimated to be 9.5 or more.

The invention claimed is:

1. A colloidal silica for metal polishing, comprising a silica particle having a surface on which a functional group having at least one carboxyl group is immobilized by covalent bonding, wherein the silica particle has a surface on which a group represented by formula (1):

(1)

wherein $R^1$ is an organic functional group having at least one carboxyl group, and $R^2$ and $R^3$ are —$OR^4$, where $R^4$ is a hydrogen atom, or a hydrocarbon group,
is present.

2. The colloidal silica according to claim 1, wherein the silica particle has a surface modified with a silane coupling agent or a hydrolysis condensation product thereof, the silane coupling agent containing a functional group having at least one carboxyl group or a precursor group thereof.

3. The colloidal silica according to claim 2, wherein the silane coupling agent is represented by formula (2):

(2)

wherein $Q^1$ is a hydrogen atom or a hydrocarbon group, $R^5$ and $R^6$ are identical or different, and each represents a hydrogen atom, a hydrocarbon group, or —$OR^7$, where $R^7$ is a hydrogen atom or a hydrocarbon group, and $R^1$ is an organic functional group having at least one carboxyl group.

4. The colloidal silica according to claim 1, wherein the metal is a transition metal.

5. The colloidal silica according to claim 4, wherein the transition metal is at least one member selected from cobalt, ruthenium, copper, tungsten, tantalum, and titanium.

6. The colloidal silica according to claim 1, wherein the silica particle has an aggregation ratio of 1.2 or more and 5.5 or less.

7. The colloidal silica according to claim 1, wherein the silica particle has an average secondary particle size of 6 nm or more and 400 nm or less.

8. The colloidal silica according to claim 1, wherein the silica particle has an average primary particle size of 5 nm or more and 200 nm or less.

9. The colloidal silica according to claim 1, wherein the silica particle has a BET specific surface area of 15 to 550 m$^2$/g.

10. The colloidal silica according to claim 1, wherein an amount of carboxyl groups on the surface of the silica particle is 0.05 atomic % or more and 0.5 atomic % or less.

11. The colloidal silica according to claim 1, wherein an amount of carboxyl groups on the surface of the silica particle is 0.07 atomic % or more and 0.3 atomic % or less.

\* \* \* \* \*